(12) United States Patent
Lee

(10) Patent No.: US 10,877,371 B1
(45) Date of Patent: Dec. 29, 2020

(54) GLOBAL DYNAMIC DETECTION METHOD AND SYSTEM FOR PROTECTIVE FILM OF PHOTOMASK

(71) Applicant: SOUTHERN TAIWAN UNIVERSITY OF SCIENCE AND TECHNOLOGY, Tainan (TW)

(72) Inventor: Yu-Ching Lee, Tainan (TW)

(73) Assignee: SOUTHERN TAIWAN UNIVERSITY OF SCIENCE AND TECHNOLOGY, Tainan (TW)

( * ) Notice: Subject to any disclaimer, the term of this patent is extended or adjusted under 35 U.S.C. 154(b) by 0 days.

(21) Appl. No.: 16/826,314

(22) Filed: Mar. 23, 2020

(30) Foreign Application Priority Data

Dec. 13, 2019 (TW) .............................. 108145795 A

(51) Int. Cl.
| | | |
|---|---|---|
| *G03F 1/84* | (2012.01) | |
| *G03F 1/48* | (2012.01) | |
| *G01M 7/02* | (2006.01) | |
| *G01M 11/00* | (2006.01) | |
| *G01M 11/08* | (2006.01) | |
| *G03F 1/62* | (2012.01) | |
| *G01N 29/46* | (2006.01) | |
| *G01N 21/84* | (2006.01) | |
| *G01N 21/956* | (2006.01) | |

(52) U.S. Cl.
CPC .............. *G03F 1/84* (2013.01); *G01M 7/022* (2013.01); *G01M 7/025* (2013.01); *G01M 11/005* (2013.01); *G01M 11/081* (2013.01); *G01N 21/8422* (2013.01); *G01N 29/46* (2013.01); *G03F 1/48* (2013.01); *G03F 1/62* (2013.01); *G01N 2021/95676* (2013.01)

(58) Field of Classification Search
CPC .......... G03F 1/84; G03F 1/48; G01M 11/081; G01M 11/005; G01M 7/022; G01M 7/025; G01B 11/16; G01B 11/30; G01B 11/303; G01B 11/306; G01N 29/045; G01N 29/12; G01N 21/70; G01N 21/8422; G01N 21/8806; G01N 21/88; G01N 21/958; G01N 2021/8427; G01N 2021/95676; G01H 13/00; G01H 9/00; G01H 9/008
See application file for complete search history.

(56) References Cited

U.S. PATENT DOCUMENTS

| | | | | |
|---|---|---|---|---|
| 4,966,457 | A * | 10/1990 | Hayano | G01N 21/94 250/559.41 |
| 6,477,898 | B1 * | 11/2002 | Han | G01N 29/12 73/579 |
| 6,662,661 | B2 * | 12/2003 | Stach | G03F 1/20 73/655 |
| 9,933,699 | B2 * | 4/2018 | Lee | G03F 1/84 |

(Continued)

*Primary Examiner* — Gordon J Stock, Jr.

(57) ABSTRACT

A global dynamic detection method for a protective film of a photomask includes: causing the protective film to undergo broadband oscillation; applying a broadband signal to the protective film undergoing multi-frequency oscillation; transforming an optical time-domain signal reflecting off the protective film to obtain a frequency spectrum with multiple resonance frequencies; and detecting the protective film with the frequency spectrum comprehensively to ensure the quality of the protective film. A global dynamic detection system for use with the global dynamic detection method is further provided.

10 Claims, 6 Drawing Sheets

(56) References Cited

U.S. PATENT DOCUMENTS

| | | | | |
|---|---|---|---|---|
| 9,991,670 B2* | 6/2018 | Takehisa | ............... | H01S 5/0092 |
| 10,161,915 B2* | 12/2018 | Riviere | ................. | G01N 29/11 |
| 2011/0014577 A1* | 1/2011 | Hashimoto | ......... | G03F 7/70983 |
| | | | | 430/325 |

* cited by examiner

Generating multi-frequency oscillation by using the vibration generating unit 2, thereby causing the protective film 122 to generate multi-mode oscillation frequency ~41

Applying a broadband signal to the protective film 122 generating multi-frequency oscillation frequency, and receiving a plurality of optical signals reflecting off the protective film 122 ~42

Comparing a frequency spectrum characterized by multiple resonance frequencies and obtained by using the optical signals and another frequency spectrum characterized by multiple resonance frequencies and obtained from the protective film 122 at different points in time to yield a detection result of the protective film 122 ~43

FIG. 4

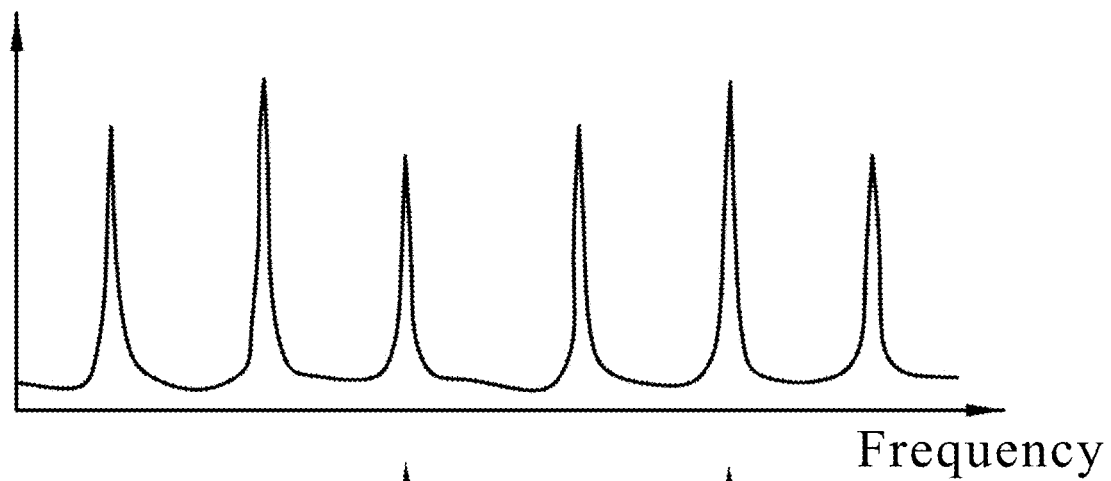
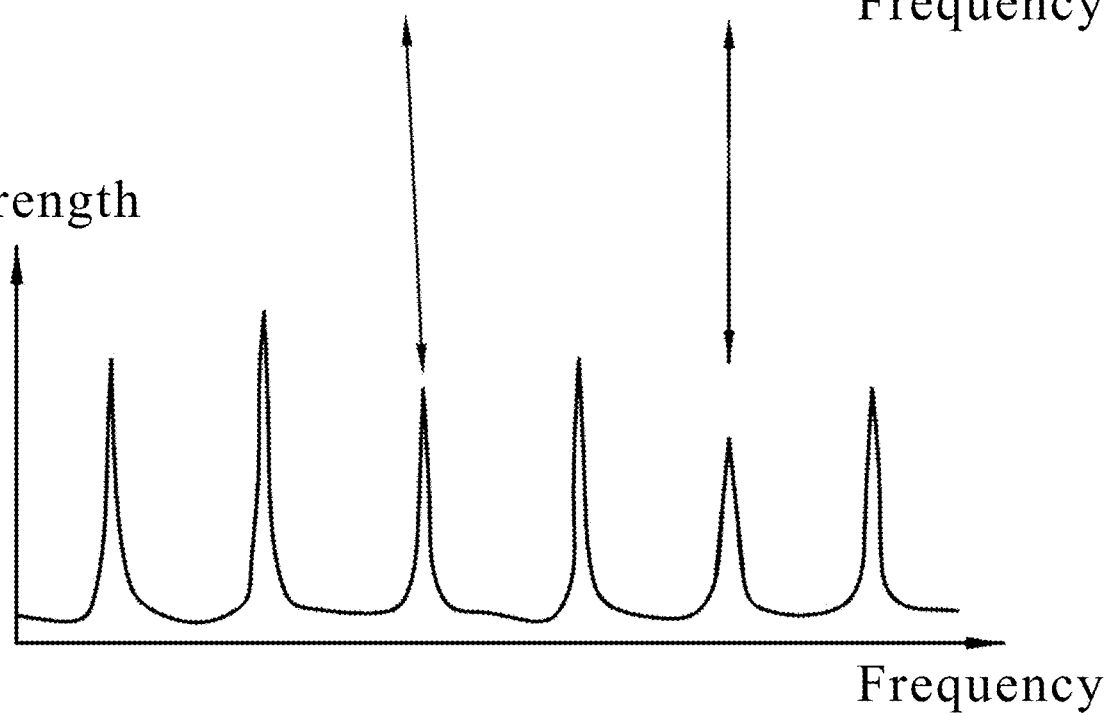
FIG. 6

GLOBAL DYNAMIC DETECTION METHOD AND SYSTEM FOR PROTECTIVE FILM OF PHOTOMASK

CROSS-REFERENCE TO RELATED APPLICATION

This non-provisional application claims priority under 35 U.S.C. § 119(a) on Patent Application No. 108145795 filed in Taiwan, R.O.C. on Dec. 13, 2019, the entire contents of which are hereby incorporated by reference.

BACKGROUND OF THE INVENTION

1. Field of the Invention

The present disclosure relates to detection method and systems, and in particular to a global dynamic detection method and system for a protective film of a photomask.

2. Description of the Related Art

The nanoscale pitches of semiconductor chips are increasingly small, as electronic products are becoming smaller, more versatile and more robust. Consequently, unit area of each chip can carry more transistors to meet nanoscale requirements. However, a lithography process is a crucial technology as to whether the pitches of semiconductor chips can meet nanoscale requirements.

Lithography involves making photomasks from wiring patterns and casting projections of the wirings on wafers coated with photoresists by an optical imaging principle, so as to copy the wiring patterns precisely to the photoresists by photomask pattern irradiation. After that, chips are made from the wafers by development, etching and plating. Therefore, photomask quality is a major factor in the outcome of lithography especially when the process thereof is carried out with extreme ultraviolet.

Referring to FIG. 1, a conventional photomask includes a light-penetrable substrate 11 whose surface has a wiring pattern 111 and a pellicle 12 for covering the wiring pattern 111. The pellicle 12 has an outer frame 121 disposed on the surface of the light-penetrable substrate 11 and surrounding the wiring pattern 111 and a transparent protective film 122 for covering the top of the outer frame 121 and covering the wiring pattern 111. The protective film 122 blocks external particle contaminants which might otherwise contaminate the wiring pattern 111, so as to ensure exposure quality. However, the protective film 122 is made of organic polymer and thus deteriorates because of its lengthy exposure to ultraviolet, deep ultraviolet or extreme ultraviolet, its vulnerability to an inappropriate process, its contamination by particles, illumination-induced aging or operation-related collisions. Its deterioration leads to poor exposure results and even causes contamination to exposure machines. The exposure machines thus contaminated are likely to fail and thereby affect wafer fabrication.

In view of the aforesaid drawbacks of the prior art, it is important to monitor and detect the quality of a protective film of a photomask. For example, U.S. Pat. No. 9,933,699B discloses a method for estimating the aging of a protective film. The method involves providing a wave generator and a receiver which are disposed on two opposing sides of a protective film, respectively, and parallel to the surface of the protective film to allow the protective film to vibrate and thus generate oscillation. The wave generator generates signals which pass through the surface of the protective film. Then, the receiver receives the signs which have passed through the protective film. Next, the aging state of the protective film is estimated according to the drift of the resonance frequency signal in response to the resonance frequency produced by the oscillation wave of the protective film.

BRIEF SUMMARY OF THE INVENTION

An objective of the present disclosure is to provide global dynamic detection technology pertaining to a protective film of a photomask.

To achieve at least the above objective, the present disclosure provides a global dynamic detection method, comprising the steps of:

causing, by a vibration generating unit capable of generating broadband oscillation, the protective film to generate multi-frequency oscillation;

applying a broadband signal to the protective film generating multi-frequency oscillation and receiving an optical time-domain signal reflecting off the protective film;

transforming the optical time-domain signal into detection frequency-domain data of the protective film; and comparing the detection frequency-domain data of the protective film and reference frequency-domain data of the protective film to yield a detection result of the protective film.

Another objective of the present disclosure is to provide a global dynamic detection system for detecting a protective film of a photomask. The photomask comprises a light-penetrable substrate whose surface has a wiring pattern and a protective film for covering the wiring pattern.

To achieve at least the above objective, the present disclosure provides a global dynamic detection system for detecting a protective film of a photomask, comprising a vibration generating unit and a detection unit.

The vibration generating unit generates broadband vibration, thereby causing the protective film to generate multi-frequency oscillation.

The detection unit comprises a light source module and a receiving processor.

The light source module generates a broadband signal to be applied to the protective film. The receiving processor receives an optical time-domain signal reflecting off the protective film. The optical time-domain signal is then transformed to produce a frequency spectrum with multiple resonance frequencies. The frequency spectrum with multiple resonance frequencies is compared with another frequency spectrum characterized by multiple resonance frequencies and obtained from the protective film to yield a detection result of the protective film.

The advantages of a global dynamic detection method and system for a protective film of a photomask in the aforesaid embodiments are as follows: the protective film generates multi-frequency oscillation, and then a broadband signal is applied to the protective film generating multi-frequency oscillation, so as for an optical time-domain signal to reflect off the protective film; then, the optical time-domain signal undergoes transformation to produce a frequency spectrum with multiple resonance frequencies; thus, the frequency spectrum detects the protective film comprehensively, so as to ensure the quality of the protective film.

BRIEF DESCRIPTION OF THE DRAWINGS

The other features and advantages of the present disclosure are depicted by accompanying drawings as briefly described below.

FIG. 4 is a flowchart of a global dynamic detection method according to an embodiment of the present disclosure.

FIG. 6 is a schematic view of a frequency spectrum signal, showing the measured multi-frequency resonance signal frequency spectrum comparison result according to an embodiment of the present disclosure.

DETAILED DESCRIPTION OF THE INVENTION

To facilitate understanding of the object, characteristics and effects of this present disclosure, embodiments together with the attached drawings for the detailed description of the present disclosure are provided.

Global dynamic detection technology pertaining to a protective film of a photomask is hereunder described and implemented by a global dynamic detection method and system for a protective film of a photomask according to various embodiments of the present disclosure.

The global dynamic detection method for a protective film of a photomask according to an embodiment of the present disclosure entails detecting a transparent protective film of a photomask by a global dynamic detection system in order to detect the quality of the protective film.

Figure 1:
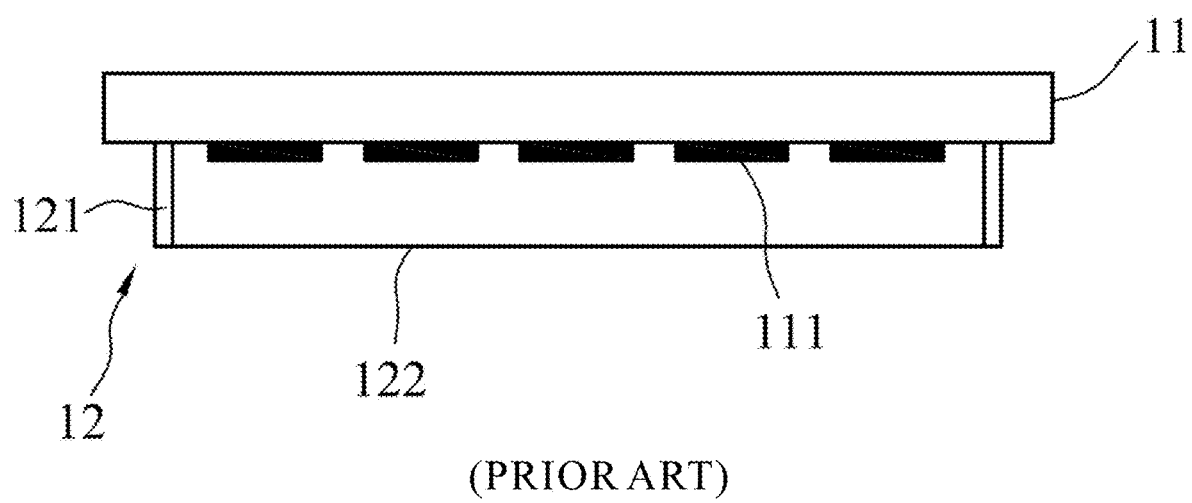
FIG. 1 (PRIOR ART) is a perspective view of a conventional photomask.

The global dynamic detection method according to an embodiment of the present disclosure is applicable to various photomasks which include a protective film, a wiring pattern and a pellicle. For instance, the photomask, as shown in FIG. 1, comprises a light-penetrable substrate 11 whose surface has a wiring pattern 111 and a pellicle 12 for covering the wiring pattern 111. The pellicle 12 has an outer frame 121 disposed on the surface of the light-penetrable substrate 11 and surrounding the wiring pattern 111 and a protective film 122 for covering the top of the outer frame 121 and covering the wiring pattern 111. However, the present disclosure is not limited thereto.

Figure 2:
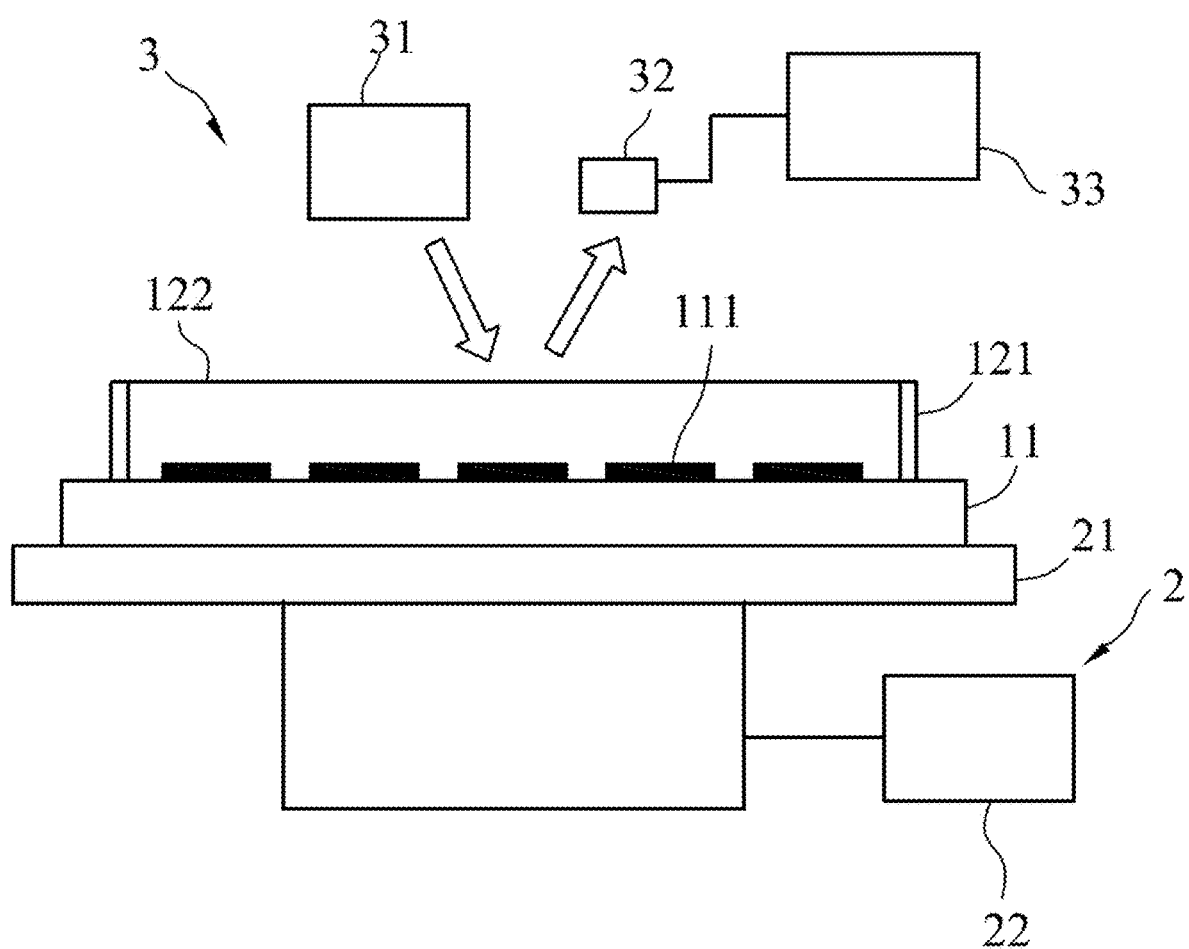
FIG. 2 is a schematic view of a global dynamic detection system for use with a global dynamic detection method according to an embodiment of the present disclosure.
Figure 3:
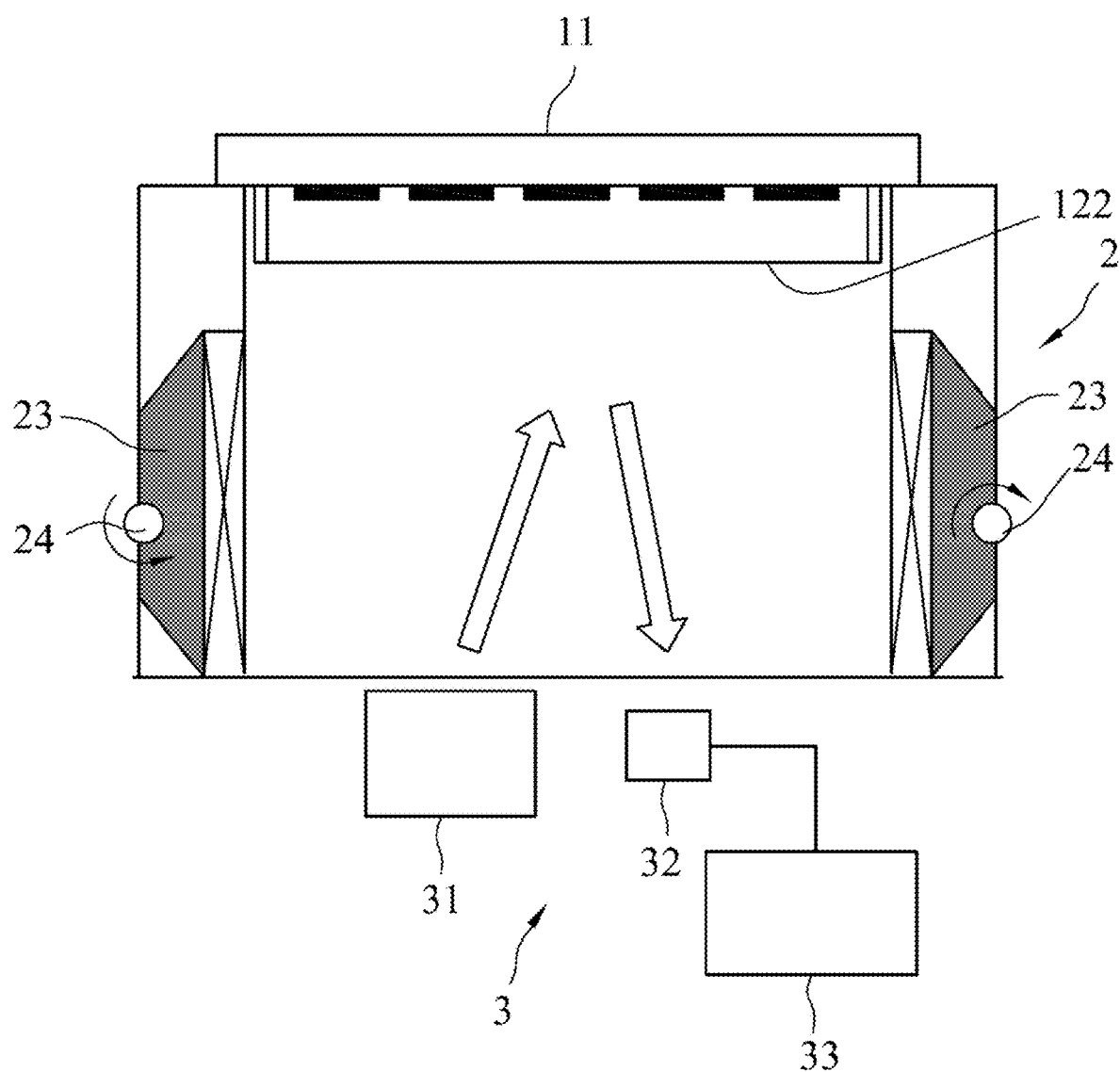
FIG. 3 is a schematic view of a vibration generating unit of the global dynamic detection system according to an embodiment of the present disclosure.

Referring to FIGS. 2, 3, in an embodiment, the global dynamic detection system comprises a vibration generating unit 2 and a detection unit 3.

The vibration generating unit 2 generates broadband oscillation, and thus the protective film 122 generates multi-mode oscillation. As shown in FIG. 2, the vibration generating unit 2 has an oscillator 21 connected to a surface of the protective film 122 (the surface faces away from the light-penetrable substrate 11) and a signal processor 22 connected to the oscillator 21 signal to generate a frequency-sweep signal per unit time and thus cause the oscillator 21 to generate multi-mode oscillation, thereby allowing the protective film 122 to generate multi-mode oscillation.

In another embodiment, as shown in FIG. 3, the vibration generating unit 2 has at least one speaker 23 disposed in such a manner to face the same direction as the protective film 122 and generate white noise. The at least one speaker 23 is fixedly or rotatably disposed in the vicinity of the protective film 122 to select the position of emission of white noise. Furthermore, the protective film 122 brings about multi-mode oscillation under the action of the at least one speaker 23. As shown in FIG. 3, the vibration generating unit 2 has two speakers 23 which flank the protective film 122 and each rotate about a rotating shaft 24 to adjust the position of emission of white noise. However, in practice, the number of the speakers 23 is subject to changes as needed.

The detection unit 3 and the protective film 122 are on the same side but on different planes to apply a broadband signal to the protective film 122 generating multi-frequency oscillation frequency. The broadband signal is a light with different wavelengths and received from an optical time-domain signal reflecting off the protective film 122. The detection unit 3 detects the protective film 122 at a frequency spectrum obtained by transformation of the optical time-domain signal and having multiple resonance frequencies (for example, the frequency spectrum is expressed or processed by detection frequency-domain data of the protective film 122) to yield a detection result of the protective film 122.

For instance, the detection unit 3 comprises a light source module and a receiving processor. For example, the detection unit 3 comprises a light source module 31, a receiver 32 and a processor 33. The receiver 32 and the processor 33 operate together to function as the receiving processor.

For instance, the light source module 31 emits laser, for example, laser with adjustable wavelength, to generate a light with different wavelengths. In general, the protective film 122 is highly light-penetrable. However, when made of different materials or subjected to deformations or defects, the protective film 122 reflects lights with different wavelengths differently. Thus, a broadband signal of lights (with different wavelengths) generated by the light source module 31 is applied to the protective film 122 generating multi-frequency oscillation to obtain an optical signal reflecting off the protective film 122. Consequently, the present disclosure precludes a drawback of the prior art: distortion occurs to the conventional detection of the quality of the protective film 122, when the detection process is performed by casting a light with a single (specific) wavelength on the protective film 122 which then reflects the light with the single wavelength, because the light with the specific wavelength cannot reflect off the protective film 122 or the protective film 122 is defective in such a manner to keep the reflection wavelength out of the range of the applied specific wavelength.

The receiver 32 is, for example, a light sensing component, such as CCD. The receiver 32 receives a time-domain strength signal reflecting off the protective film 122. The processor 33 is a central processor or computer in signal connection with the receiver 32 and serves a means of performing Fourier transform on a strength signal reflecting off the protective film 122 to obtain a frequency-domain signal (for example, expressed or processed by the detection frequency-domain data of the protective film 122) at a frequency spectrum with multiple resonance frequencies. The frequency spectrum (for example, expressed by the detection frequency-domain data) with multiple resonance frequencies is compared with another frequency spectrum (for example, expressed by reference frequency-domain data of the protective film 122) characterized by multiple resonance frequencies and obtained from the protective film 122 to yield a detection result of the protective film 122. The comparison of the frequency spectra (expressed or processed by the frequency-domain data) involves comparing the frequency spectrum in terms of a drift of the central position of resonance frequency, an increase/decrease of resonance frequency, and a strength variation of resonance frequency. The comparison result is used to detect the quality, the degree of aging, and defects of the protective film 122.

The receiver 32 and the processor 33 are standalone or integrated into a single machine as needed or according to machine design. In this embodiment, the receiver 32 and the processor 33 are standalone, but the present disclosure is not limited thereto.

The other frequency spectrum (for example, expressed by the reference frequency-domain data) to be compared with the frequency spectrum (for example, expressed by the detection frequency-domain data) obtained by the current instance of detection of the protective film 122 can be a standard frequency spectrum (for example, expressed by the reference frequency-domain data) obtained under the same detection condition of the protective film 122 or a frequency spectrum (for example, expressed by the reference frequency-domain data) obtained in a preceding instance under the same detection condition of the protective film 122.

Referring to FIG. 4, in the embodiment, the global dynamic detection method comprises steps 41 to 43 described below.

The global dynamic detection method in the embodiment is implemented by the global dynamic detection system. In step 41 illustrated by FIG. 4, the vibration generating unit 2 shown in FIG. 2 or FIG. 3 generates multi-frequency oscillation, thereby causing the protective film 122 to generate multi-mode oscillation.

In step 42, a broadband signal is applied to the protective film 122 generating multi-frequency oscillation frequency, and an optical signal reflecting off the protective film 122 is received.

For instance, in the step 42, the light source module 31 generates a light with different wavelengths, and then the light falls on the protective film 122 generating multi-frequency oscillation. The receiver 32 receives the optical time-domain signal reflecting off the protective film 123.

In step 43, a frequency spectrum (for example, expressed by the detection frequency-domain data of the protective film 122) characterized by multiple resonance frequencies and obtained by transformation of the optical time-domain signal and another frequency spectrum (for example, expressed by the reference frequency-domain data of the protective film 122) characterized by multiple resonance frequencies and obtained from the protective film 122 at different points in time are compared to yield a detection result of the protective film 122.

For instance, in the step 43, the processor 33 performs Fourier transform on the optical time-domain signal received by the receiver 32 to obtain a frequency spectrum (for example, expressed or processed by the detection frequency-domain data of the protective film 122) with multiple resonance frequencies, and then the frequency spectrum (for example, the detection frequency-domain data) and another frequency spectrum (for example, expressed by the reference frequency-domain data) characterized by multiple resonance frequencies and obtained from the protective film 122 are compared to compare the frequency spectra in terms of a drift of the central position of resonance frequency, an increase/decrease of resonance frequency, and a strength variation of resonance frequency, so as to obtain a comparison result. The comparison result is used to detect the quality, the degree of aging, and defects of the protective film 122.

Figure 5:
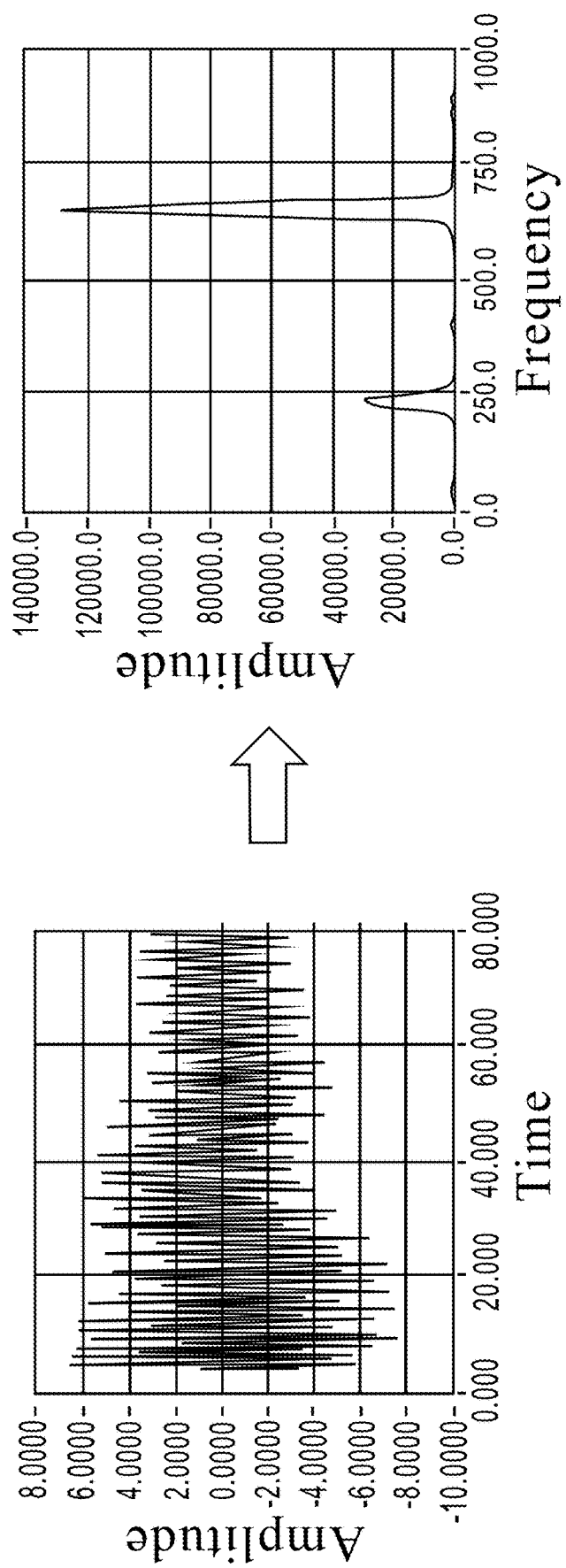
FIG. 5 is a schematic view of a frequency spectrum signal, showing the obtained multi-frequency resonance signal frequency spectrum according to an embodiment of the present disclosure.

For instance, as shown in FIG. 5, the optical signal reflecting off the protective film 122 undergoes Fourier transform to produce a frequency spectrum with multiple resonance frequencies. Therefore, as shown in FIG. 6, the current quality of the protective film 122 is detected in real time and comprehensively by comparing the frequency spectra obtained by measurement and transformation carried out at different points in time in terms of variations of resonance frequency or by comparing a standard frequency spectrum and a frequency spectrum obtained by the current instance of measurement and transformation. In the aforesaid embodiment, the detection frequency-domain data of the protective film corresponds to a frequency spectrum with multiple resonance frequencies, whereas the reference frequency-domain data of the protective film corresponds to another frequency spectrum with multiple resonance frequencies of the protective film. The comparison of the frequency spectra or the detection of quality of the protective film are carried out in accordance with the detection frequency-domain data and the reference frequency-domain data. However, the present disclosure is not limited thereto.

Moreover, in a variant embodiment, a process error tolerance value is defined by the system or detector to determine whether to change the protective film 122 whenever a variation in the resonance frequency between different frequency spectra exceeds the process error tolerance value.

The oscillation of the vibration generating unit 2 further allows dust to fall off the protective film 122 and thus maintains the surface quality of the protective film 122.

In conclusion, a global dynamic detection method and system for a protective film of a photomask in the aforesaid embodiments of the present disclosure have advantages as follows: the protective film of the photomask generates multi-frequency oscillation, and then a light with different wavelengths is applied to the protective film generating multi-frequency oscillation, so as for an optical time-domain signal to reflect off the protective film; then, the optical time-domain signal undergoes Fourier transform to produce a frequency spectrum with multiple resonance frequencies; thus, the frequency spectrum with multiple resonance frequencies detects the protective film comprehensively for aging or damage to facilitate timely replacement of the protective film and removal of dust from the protective film, so as to ensure the quality of the photomask, increase yield, and reduce photomask maintenance and production cost. Moreover, the global dynamic detection method further overcomes a drawback of the prior art: distortion occurs to the conventional detection of the quality of the protective film, when the detection process is performed by casting a light with a single (specific) detection wavelength on the protective film, because the light with the specific wavelength cannot reflect off the protective film if the protective film has aged or has been damaged, thereby keeping the reflection wavelength out of the range of the detection wavelength.

While the present disclosure has been described by means of specific embodiments, numerous modifications and variations could be made thereto by those skilled in the art without departing from the scope and spirit of the present disclosure set forth in the claims.

What is claimed is:

1. A global dynamic detection method for a protective film of a photomask, the global dynamic detection method comprising the steps of:

causing, by a vibration generating unit capable of generating broadband oscillation, the protective film to generate multi-frequency oscillation;

applying a broadband signal to the protective film generating multi-frequency oscillation and receiving an optical time-domain signal reflecting off the protective film;

transforming the optical time-domain signal into detection frequency-domain data of the protective film; and comparing the detection frequency-domain data of the protective film and reference frequency-domain data of the protective film to yield a detection result of the protective film.

2. The global dynamic detection method of claim 1, wherein the vibration generating unit has an oscillator and a signal processor connected to an oscillator signal and adapted to generate a frequency-sweep signal per unit time and thereby allow the oscillator to generate different oscillation frequencies.

3. The global dynamic detection method of claim 1, wherein the vibration generating unit has at least one speaker for generating white noise.

4. The global dynamic detection method of claim 1, wherein the detection frequency-domain data of the protective film corresponds to a frequency spectrum having resonance frequencies, and the reference frequency-domain data of the protective film corresponds to another frequency spectrum having resonance frequencies, wherein the detection result is obtained by comparing the resonance frequencies of the frequency spectra in strength and position.

5. The global dynamic detection method of claim 1, wherein the broadband signal is provided by a light with adjustable wavelength.

6. A global dynamic detection system for detecting a protective film of a photomask, the photomask comprising a light-penetrable substrate whose surface has a wiring pattern and a protective film for covering the wiring pattern, the global dynamic detection system comprising:

a vibration generating unit for generating broadband vibration to cause the protective film to generate multi-frequency oscillation; and a detection unit having a light source module and a receiving processor, the light source module generating a broadband signal to be applied to the protective film, the receiving processor receiving an optical time-domain signal reflecting off the protective film, wherein the optical time-domain signal undergoes transformation to generate detection frequency-domain data of the protective film, and the detection frequency-domain data of the protective film is compared with the reference frequency-domain data of the protective film to yield a detection result of the protective film.

7. The global dynamic detection system of claim 6, wherein the detection unit and the protective film are on different planes.

8. The global dynamic detection system of claim 6, wherein the vibration generating unit has an oscillator connected to a surface of the protective film and a signal processor connected to an oscillator signal to generate a frequency-sweep signal per unit time and thereby allow the oscillator to generate multi-frequency oscillation, wherein the surface of the protective film faces away from the light-penetrable substrate.

9. The global dynamic detection system of claim 6, wherein the vibration generating unit has at least one speaker disposed in such a manner to face the same direction as the protective film and adapted to generate white noise.

10. The global dynamic detection system of claim 6, wherein the detection frequency-domain data of the protective film corresponds to a frequency spectrum having multiple resonance frequencies, and the reference frequency-domain data of the protective film corresponds to another frequency spectrum characterized by multiple resonance frequencies and obtained from the protective film, wherein the receiving processor performs Fourier transform on the optical time-domain signal received from the protective film to obtain the detection frequency-domain data of the protective film, and the detection result is obtained by comparing the frequency spectra to identify differences therebetween in resonance frequency strength and position.

* * * * *